| (12) United States Patent<br>Babin | (10) Patent No.: US 9,742,431 B1<br>(45) Date of Patent: Aug. 22, 2017 |
|---|---|

(54) QUATERNARY DECODER

(71) Applicant: NXP USA, Inc., Austin, TX (US)

(72) Inventor: David Cyrille Babin, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/350,795

(22) Filed: Nov. 14, 2016

(51) Int. Cl.
| *H03M 5/02* | (2006.01) |
| *H03M 5/20* | (2006.01) |
| *G06F 1/32* | (2006.01) |
| *G06F 13/40* | (2006.01) |
| *G06F 9/44* | (2006.01) |

(52) U.S. Cl.
CPC ............. *H03M 5/20* (2013.01); *G06F 1/3287* (2013.01); *G06F 9/4401* (2013.01); *G06F 13/4022* (2013.01)

(58) Field of Classification Search
CPC .... H03M 5/20; G06F 9/4401; G06F 13/4022; G06F 1/3287
USPC ....................................... 341/56, 57
See application file for complete search history.

(56) References Cited

U.S. PATENT DOCUMENTS

| 5,331,320 | A | * | 7/1994 | Cideciyan | .......... | G11B 20/1496<br>341/56 |
| 5,463,341 | A |  | 10/1995 | Karasawa | | |
| 5,969,648 | A | * | 10/1999 | Garnett | ................ | H03M 5/20<br>341/56 |
| 6,674,712 | B1 | * | 1/2004 | Yang | .................. | H04J 13/004<br>370/208 |
| 8,024,557 | B2 |  | 9/2011 | Cumming et al. | | |
| 8,725,999 | B2 |  | 5/2014 | Cumming et al. | | |
| 9,110,133 | B2 |  | 8/2015 | Wang et al. | | |
| 9,584,259 | B2 | * | 2/2017 | Millar | ................ | H04L 1/0041 |
| 2005/0258863 | A1 |  | 11/2005 | Chang et al. | | |
| 2007/0115029 | A1 |  | 5/2007 | Aunet | | |
| 2009/0172383 | A1 |  | 7/2009 | Cumming et al. | | |
| 2012/0005471 | A1 |  | 1/2012 | Cumming et al. | | |

FOREIGN PATENT DOCUMENTS

| DE | 202005011869 | 12/2005 |
| DE | 202006019773 | 3/2007 |
| DE | 102006062672 | 7/2008 |

OTHER PUBLICATIONS

Motorola, "Semiconductor Technical Data, Encoder and Decoder Pairs, CMOS," 1998, 20 pages.
Freescale Semiconductor Inc., "Data Sheet: Technical Data, i.MX 6Dual/6Quad Automotive and Infotainment Applications Processors," 2012-2015, 169 pages.

* cited by examiner

*Primary Examiner* — Brian Young

(57) ABSTRACT

Embodiments are provided for a quaternary decoder that includes a plurality of decoder circuits, each decoder circuit coupled to a respective input line of a plurality of quaternary interface lines and to a respective pair of binary output lines; and a control logic circuit having a plurality of control signal lines coupled to each of the plurality of decoder circuits, the control logic circuit configured to: output a first sequence of logic levels, and output a second sequence of logic levels after the first sequence is complete; wherein at a time after the second sequence is complete, each decoder circuit is configured to output a pair of binary data values that correspond to a quaternary state of the respective input line, the quaternary state being one of four quaternary states including a logic high state, a logic low state, a floating state, and a tie-back state.

20 Claims, 8 Drawing Sheets

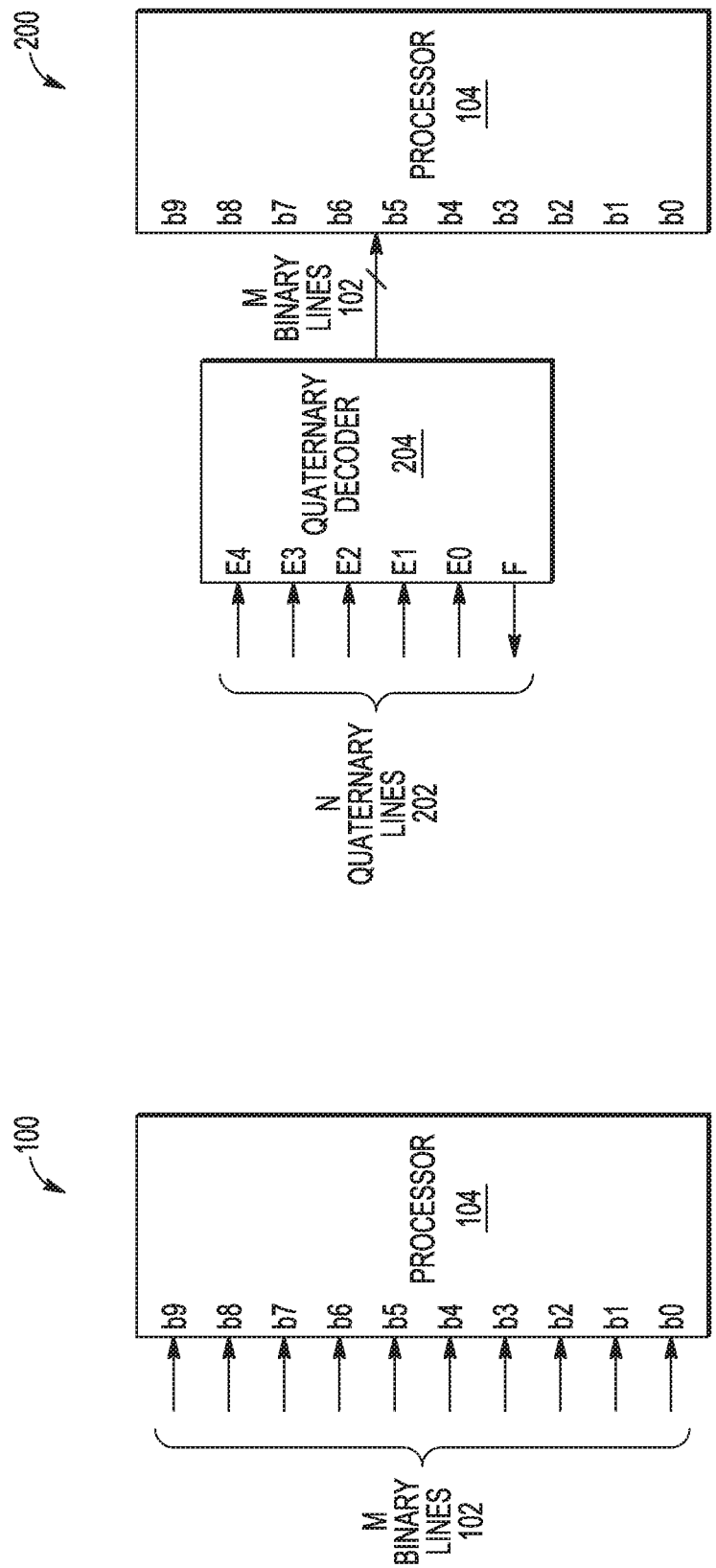

CONTROL LOGIC SEQUENCES 700

| SEQUENCE | A | B | C | D |
|---|---|---|---|---|
| 1 | 1 | ⊓ | 0 | 0 |
| 2 | 0 | 0 | 1 | ⊓ |

TRUTH TABLE 702

| | SEQUENCE | MSB | LSB | DECODED STATE | E | F |
|---|---|---|---|---|---|---|
| (1) | 1 | - | 0 | - | TIED LOW | FLOAT |
| (2) | 2 | 0 | 0 | LOW | TIED LOW | FLOAT |
| (3) | 1 | - | 1 | - | TIED HIGH | FLOAT |
| (4) | 2 | 1 | 1 | HIGH | TIED HIGH | FLOAT |
| (5) | 1 | - | 0 | - | FLOATED | FLOAT |
| (6) | 2 | 1 | 0 | FLOAT | FLOATED | FLOAT |
| (7) | 1 | - | 1 | - | TIED TO F | TIED TO E |
| (8) | 2 | 0 | 1 | TIE-BACK | TIED TO F | TIED TO E |

QUATERNARY DECODER

BACKGROUND

Field

This disclosure relates generally to decoders, and more specifically, to a quaternary decoder that decodes quaternary logic states.

Related Art

Some processors use dedicated binary inputs for selection of their boot-up sources and boot-up modes. Dedicated binary inputs are preferred due to their convenience for the user, rather than multiplexed I/O (input/output) that requires external circuitry to change the multiplexed I/O from the boot selection function to other functions. Additionally, multiplexing binary inputs with a bus causes extra loading on the bus, which is detrimental especially for high-speed busses prevalent on modern processors. However, these dedicated binary source- and mode-selection inputs tie up a large footprint of valuable input/output (I/O) area that could otherwise be used for other functions. Additionally, processors having multiple boot-up sources and multiple modes for each source require a large number of binary inputs, which in turn requires the use of packages with larger ball counts to accommodate the source- and mode-selection inputs.

BRIEF DESCRIPTION OF THE DRAWINGS

The present invention may be better understood, and its numerous objects, features, and advantages made apparent to those skilled in the art by referencing the accompanying drawings.

FIG. 1 illustrates a block diagram depicting a prior art system receiving binary lines.

FIG. 2 illustrates a block diagram depicting an example system that includes a quaternary decoder receiving quaternary lines, according to some embodiments of the present disclosure.

FIG. 7 illustrates a truth table for quaternary logic states determined by the input decoder circuit, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 3:
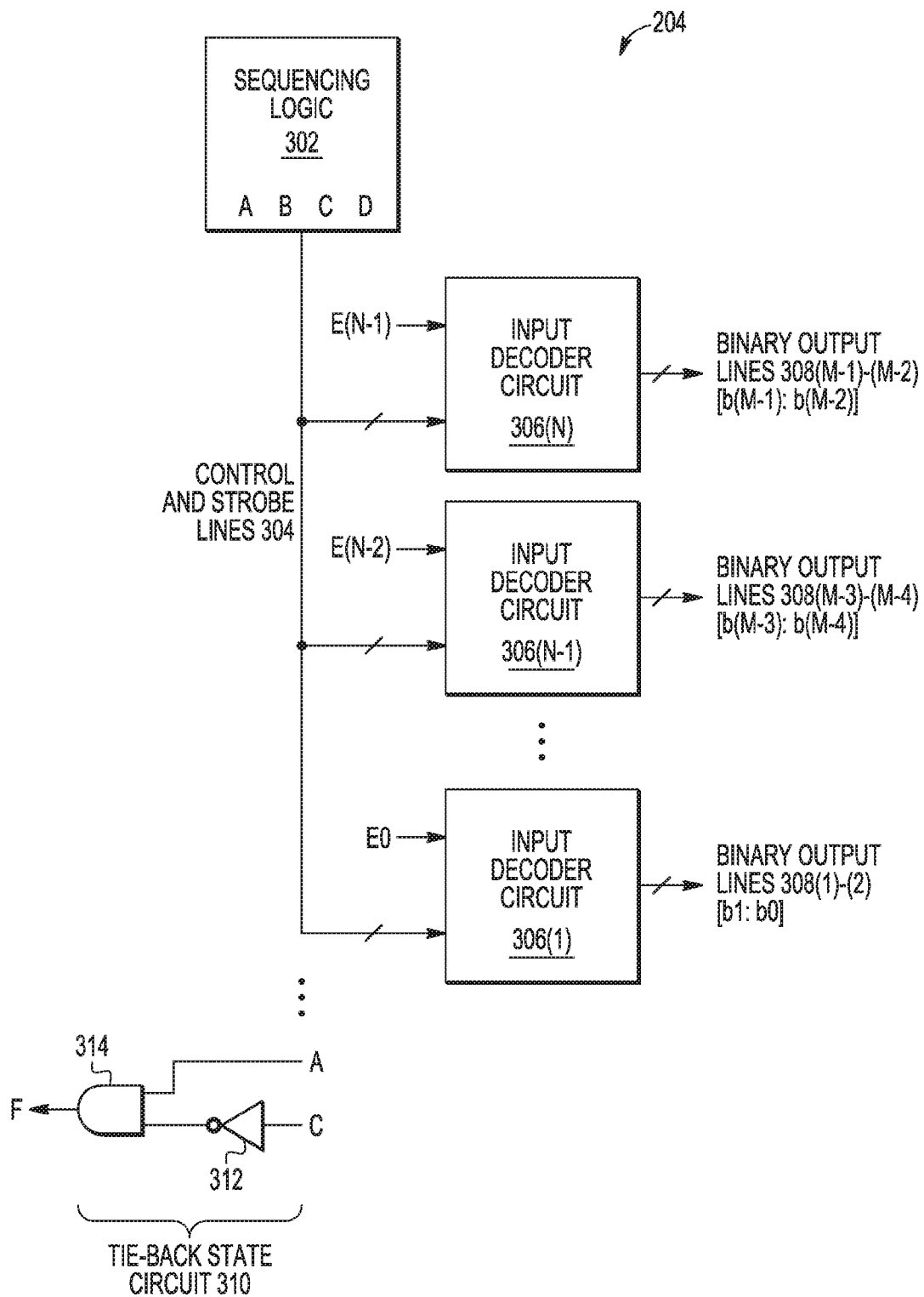
FIG. 3 illustrates a block diagram depicting an example quaternary decoder, according to some embodiments of the present disclosure.

The following sets forth a detailed description of various embodiments intended to be illustrative of the invention and should not be taken to be limiting.

Overview

The present disclosure provides a quaternary decoding approach for reducing the number of input signals needed for a processor boot-up source and mode selection by use of quaternary logic states. Rather than using an M number of binary lines that carry binary logic states to achieve a given number of possible combinations, the present disclosure provides that the same number of possible combinations may be achieved by using an N number of quaternary lines that carry quaternary logic states, where N is less than M. The present quaternary decoding approach allows the reduction of the package ball count required to provide a selection from among the possible combinations. Additionally, the present quaternary decoding approach may be utilized in other applications that require an input selection of one of several possible functions. For example, the present quaternary decoding approach may be utilized in appliances having a processor that allows user selection of multiple modes of operation. The quaternary decoding approach described herein can be realized with existing digital CMOS (complementary metal-oxide-semiconductor) technology, which avoids analog circuitry that is susceptible to integrated circuit (IC) process, voltage, and temperature (PVT) variations.

Example Embodiments

FIG. 1 illustrates a prior art system 100 including a processor 104 that receives an M number of binary lines 102, where M is an integer of 1 or more. Binary lines 102 are input lines that provide a set of binary digits provided in parallel, where each line provides a binary digit (or bit). In the embodiment shown, 10 binary input lines provide 10 binary digits for 1024 (or 2^10) possible selections. As used herein, a set of binary digits has a least significant bit (LSB) and a most significant bit (MSB), notated herein with brackets and a colon as [MSB:LSB]. For example, the 10 binary inputs lines that each provide a bit b0 through b9 are notated as [b9:b0]. Each binary digit may be implemented as one of two binary logic states, either a logic high state (e.g., 1) or a logic low state (e.g., 0). It is noted that binary lines 102 in FIG. 1 are each connected to external I/O (input/output) connections of a package, such as to ball grid array (BGA) solder balls having a uniform diameter.

FIG. 2 illustrates an example system 200 that includes a quaternary decoder 204 that receives an N number of quaternary lines 202, where N is an integer of 1 or more. Quaternary lines 202 include a number of input lines that provide a set of quaternary digits, where each line provides a quaternary digit. Quaternary lines 202 also include an output line F that is used to implement a tie-back state, as discussed below. In the embodiment shown, 5 quaternary input lines provide 5 quaternary digits for 1024 (or 4^5) possible selections. As used herein, a set of encoded quaternary digits has a least significant digit (LSD) and a most significant digit (MSD), notated herein with brackets and a colon as [MSD:LSD]. For example, the 5 quaternary input lines that each provide a quaternary digit E0 through E4 are notated as [E4:E0]. Each quaternary digit may be implemented as one of four quaternary states, either a logic high state (e.g., 1), a logic low state (e.g., 0), a tie-back state (e.g., tied to line F), or a floating (e.g., unconnected, such as an open connection) state. The logic low state may be implemented using a negative power supply voltage such as ground or Vss, and the logic high state may be implemented using a positive power supply voltage such as Vdd. The tie-back state may alternately carry a logic low state and a logic high state, which is further discussed below in connection with FIG. 3. The use of only two power supply voltages or levels (positive and negative) is consistent with standard CMOS practice. In some embodiments, the quaternary logic state for each quaternary input line is selectable, as further discussed below in connection with FIGS. 8 and 9.

Quaternary decoder 204 decodes the quaternary logic states of each quaternary input line into binary states and outputs binary digits corresponding to the decoded binary states on an equivalent number of binary lines. In the embodiment shown, quaternary decoder 204 outputs 10 binary lines 102. System 200 also includes a processor 104 like that shown in FIG. 1, which receives the decoded binary digits provided by binary lines 102 to make a selection. However, the binary lines 102 shown in FIG. 2 are internal lines routed within system 200 and are not connected to external I/O connections. Instead, the quaternary lines 202 are each connected to external I/O connections of the package, such as to BGA solder balls. Fewer quaternary lines are implemented in system 200 to achieve at least the same number of possible selections achieved by the number of binary lines implemented in system 100 (e.g., 1024 possible selections). System 200 therefore implements fewer external I/O connections than system 100, reducing the solder ball count of the package (e.g., 6 solder balls compared to 10 solder balls). Additionally, reducing the solder ball count also reduces the area on the package that is occupied by the solder balls, which allows the overall size of the package to be reduced or allows implementation of other functions.

Other embodiments may implement different numbers of binary lines and quaternary lines. However, it is noted that enough quaternary input lines are utilized to achieve at least the required number of binary lines. For example, a package that requires 7 binary lines would require 4 quaternary lines to achieve at least the required 128 (or 2^7) possible selections, although the 4 quaternary lines are capable of achieving up to 256 possible selections.

FIG. 3 illustrates an example quaternary decoder 204, which includes a sequencing logic circuit 302 (also referred to as a control logic circuit 302), an N number of input decoder circuits 306(1)-(N) (also referred to as decoder circuits 306), and a tie-back state circuit 310. Sequencing logic circuit 302 is configured to output four signals A, B, C, and D on control and strobe lines 304, which are received by each input decoder circuit 306. Each input decoder circuit 306 also receives a respective one of the N quaternary input lines E0 through E(N−1). Sequencing logic circuit 302 is configured to implement two sequences of logic levels, also referred to as two control logic sequences, on the signals A, B, C, and D to control components of each input decoder circuit 306 to decode a respective quaternary logic state on the respective input line E, as discussed below in connection with FIGS. 5 and 6.

Signals A and C are control lines that alternately activate and deactivate circuitry in each input decoder circuit 306, and signals B and D are strobe lines that alternately strobe or clock registers in each input decoder circuit 306. These components of each input decoder circuit 306 decode the respective quaternary logic state into a pair of decoded binary digits that are output on binary output lines 308. For example, input decoder circuit 306(1) respectively outputs bits [b1:b0] on lines 308(1) and 308(2), while input decoder circuit 306(N) respectively outputs bits [b(M-1): b(M-2)] on lines 308(M-1) and 308(M-2). The pair of binary digits are output in parallel from each input decoder circuit 306 and are combined into a single set of binary digits that provides a specific selection or determines a particular function. The components of each input decoder circuit 306 are further discussed below in connection with FIG. 4.

Signals A and C are also provided to tie-back state circuit 310, which outputs a signal F that is used as the tie-back state. Zero or more input lines E may be tied to signal F, depending on the particular selection implemented by the quaternary input lines, as further discussed below in connection with FIG. 8. Tie-back state circuit 310 includes a logic gate 314, which is an AND gate in the embodiment shown. The logic gate 314 has two inputs, one coupled to the signal A and another coupled to the signal C. Depending on whether signals A and C use logic high levels or logic low levels to activate the circuitry in the quaternary input decoders 306, tie-back state circuit 310 may also include one or more inverters coupled between one of signals A and C and a respective input of the logic gate 314. In the embodiment shown, signals A and C alternately output logic high levels, where one input of logic gate 314 is directly coupled or connected to signal A, while the other input of logic gate 314 is coupled to signal C via an inverter 312.

Figure 4:
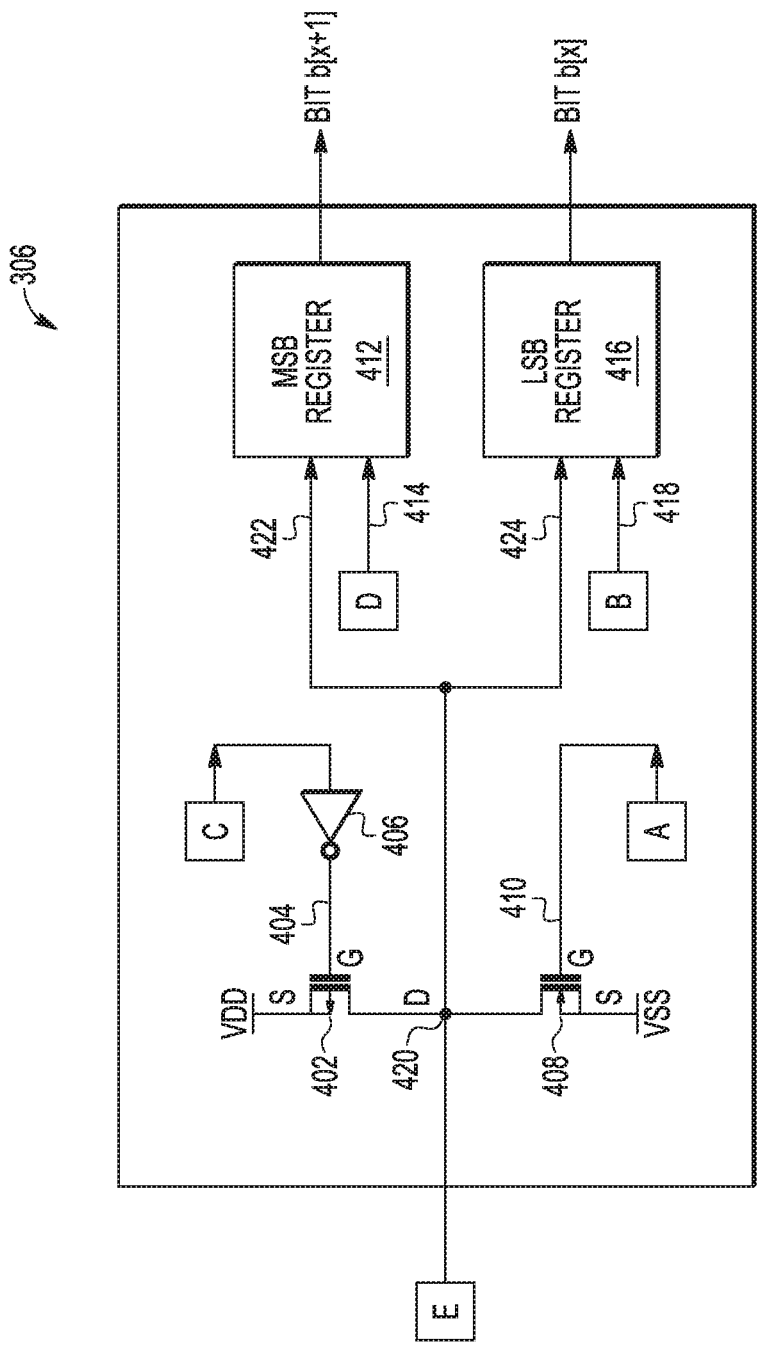
FIG. 4 illustrates a block diagram depicting an example input decoder circuit implemented in a quaternary decoder, according to some embodiments of the present disclosure.

FIG. 4 illustrates an example input decoder circuit 306 implemented in quaternary decoder 204. Input decoder circuit 306 is coupled to receive control signals A, B, C, and D respectively at nodes A, B, C, and D from sequencing logic circuit 302, and to receive a respective one of the quaternary input lines at node E that is coupled to a shared node 420. Nodes A, B, C, D, and E are illustrated as the corresponding letter surrounded by a box. Input decoder circuit 306 includes a p-type transistor 402 having a source (S) electrode coupled to a positive power supply voltage such as Vdd, a drain (D) electrode coupled to shared node 420, and a control gate (G) electrode 404 coupled to node C. Transistor 402 also has a body or well electrode tied to the source (S) electrode. Input decoder circuit 306 also includes an n-type transistor 408 having a source (S) electrode coupled to a negative power supply voltage such as Vss or ground, a drain (D) electrode coupled to shared node 420, and a control gate (G) electrode 410 coupled to node A. Transistor 408 also has a body or well electrode tied to the source (S) electrode.

Input decoder circuit 306 also includes two registers: an LSB register 416 having a data input 424 coupled to shared node 420 and an strobe input 418 coupled to node B, and an MSB register 412 having a data input 422 coupled to shared node 420 and an strobe input 414 coupled to node D. Registers 412 and 416 each include a flip-flop or latch circuit to store a binary digit. After completion of the second sequence, register 416 stores a least significant bit (LSB) b(x) and register 412 stores a most significant bit (MSB) b(x+1), which may be output from the registers 412 and 416 on a pair of binary lines.

In the embodiment shown, signals A and C alternately carry a logic high level (e.g., signals A and C are active high) in order to easily show that transistor 408 is activated during a first control logic sequence and then transistor 402 is activated during a second control logic sequence. However, since transistor 402 is implemented using a p-type transistor, an inverter 406 is included between node C and the control gate electrode 404 of transistor 402 in order to invert the logic high level of signal C to a logic low level that will activate transistor 402. In other embodiments, sequencing logic circuit 302 may provide a complementary signal C that carries a logic low level (e.g., signal C is active low) to activate transistor 402 during the second sequence and a logic high level to deactivate transistor 402 during the first sequence.

The p-type transistor 402 and the n-type transistor 408 are weak transistors in that they source (e.g., drive) or sink a small amount of current, such as 100 microamperes (uA), in order to test the quaternary logic state present at the shared node 420. In this manner, quaternary input decoder acts as a state machine that decodes the quaternary logic state into two binary digits. Transistors 402 and 408 may be implemented using MOSFET (metal-oxide-semiconductor field-effect-transistor) technology, such as standard CMOS technology. The logic low levels of the signals A, B, C, and D may be implemented using a negative power supply voltage such as ground or Vss, and the logic high levels of the signals A, B, C, and D may be implemented using a positive power supply voltage such as Vdd. It is noted that the sourcing and sinking currents provided by the positive and negative power supplies described herein (e.g., 1 to 3 amps) are much greater than the sourcing and sinking currents of transistors 402 and 408.

Figure 5:
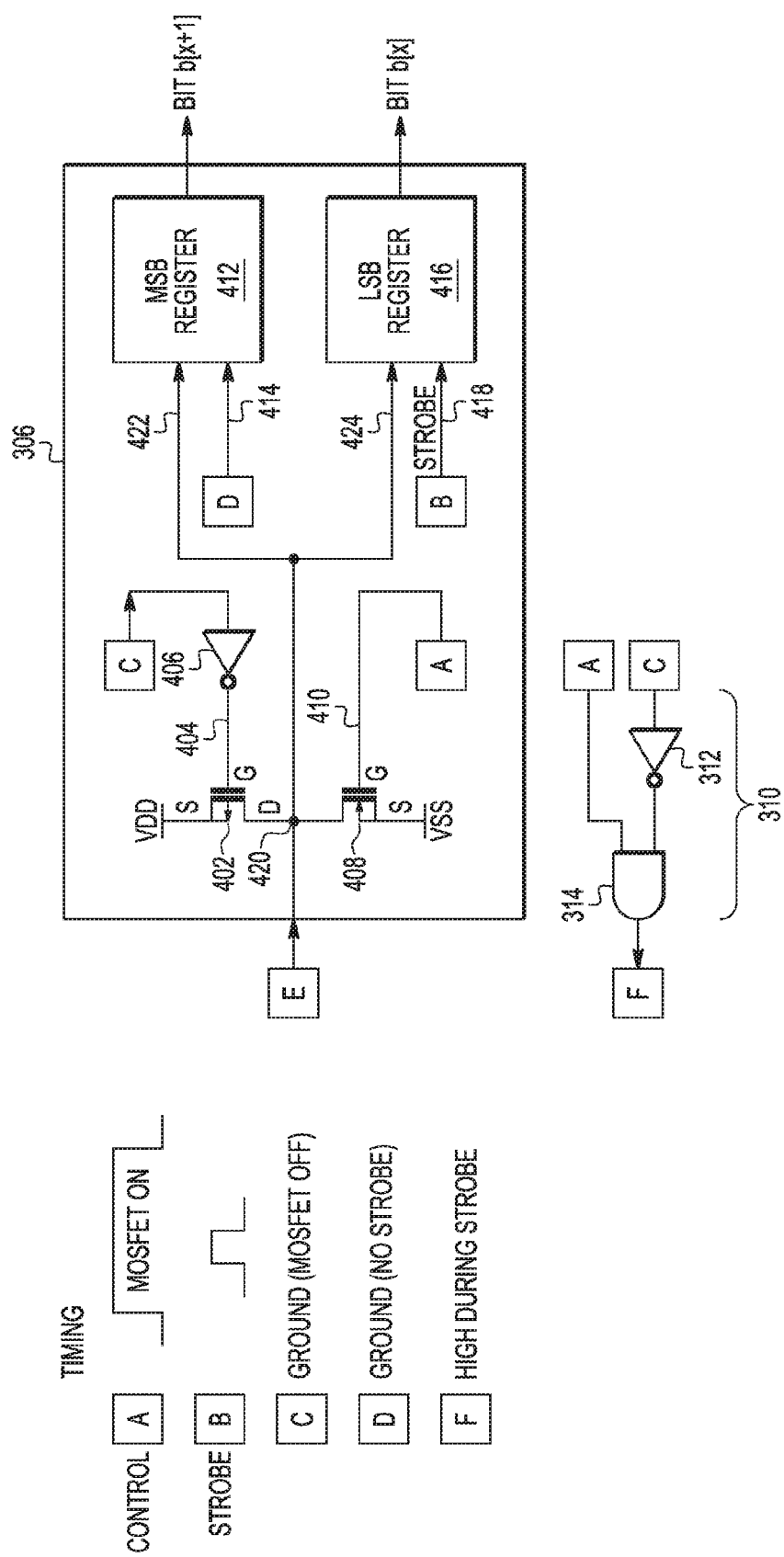
FIGS. 5 and 6 illustrate block diagrams depicting operation of an example input decoder circuit, according to some embodiments of the present disclosure.

FIG. 5 illustrates operation of an example input decoder circuit 306 during a first sequence implemented in each input decoder circuit 306. Sequencing logic circuit 302 is configured to alternately output a first set of logic levels on signals A, B, C, and D that are received at nodes A, B, C, and D as a first control logic sequence and a second set of logic levels on signals A, B, C, and D that are subsequently received at nodes A, B, C, and D as a second control logic sequence. A summary of the logic levels of the first control logic sequence is shown on the left side of FIG. 7. The first control logic sequence (illustrated in FIG. 7 as Sequence 1 of control logic sequences 700) indicates that, during a first period of time, signal C is held at a steady logic low level (e.g., "0") to deactivate transistor 402 (e.g., is not conducting), and signal D is held at a steady logic low level (e.g., "0"), which disables MSB register 412 or otherwise prevents MSB register 412 from storing a value. Signal A is held at a steady or stable logic high level (e.g., "1") to activate transistor 408 (e.g., is conducting) for an activation period of time (e.g., from a first time to a second time), and signal B is pulsed within the activation period of time (e.g., pulsed between the first time and the second time). The timing of the signals during the first control logic sequence is also shown on the left side of FIG. 5.

When transistor 408 is activated, it begins to sink a small current from shared node 420. Signal B is strobed with a logic high level pulse while transistor 408 is actively sinking current. In other words, signal B goes high after transistor 408 is activated by signal A going high, and signal B goes low before transistor 408 is deactivated by signal A going low. It is also noted that signal B is strobed after a settle time has elapsed to allow a decoded binary state (also referred to as a bit state) produced at shared node 420 to become stable. The logic high level pulse of signal B activates LSB register 416 to store the stable bit state at node 420 as a binary digit (e.g., 0 or 1). Transistor 408 is then deactivated after strobe is complete. It is noted that during the first control logic sequence, signal A carries a logic high level and signal C carries a logic low level, which results in signal F carrying a logic high level.

Figure 6:
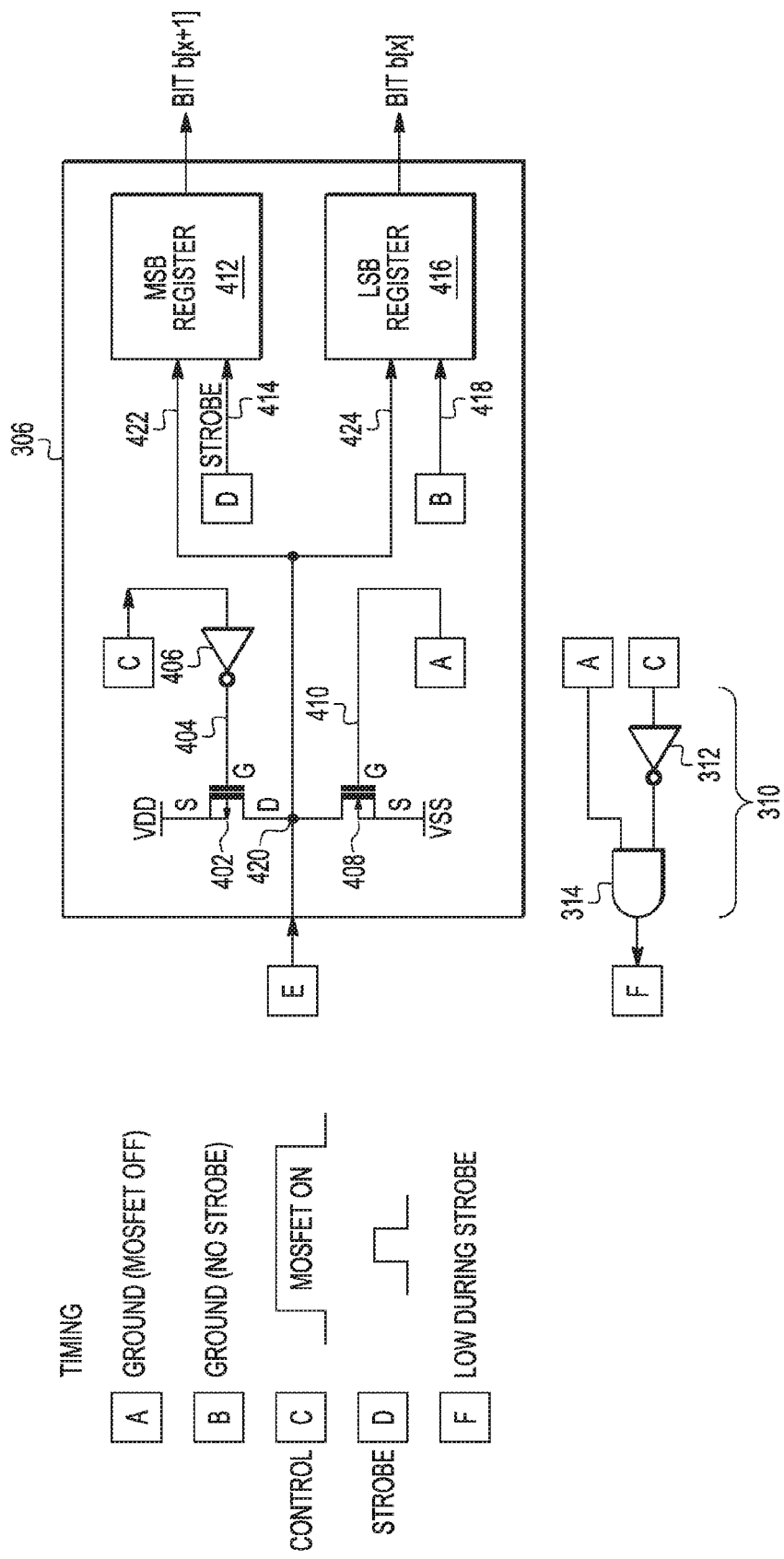

FIG. 6 illustrates operation of an example input decoder circuit 306 during a second sequence implemented in each input decoder circuit 306. The second control logic sequence (illustrated as Sequence 2 of control logic sequences 700) indicates that, during a second period of time subsequent to the first period of time, signal A is held at a steady logic low level (e.g., "0") to deactivate transistor 408 (e.g., is not conducting), and signal B is held at a steady logic low level (e.g., "0"), which causes LSB register 426 to retain the bit state stored during the first sequence. Signal C is held at a steady logic high level (e.g., "1"), which is inverted by inverter 406 to activate transistor 402 (e.g., is conducting) for another activation period of time (e.g., from a third time to a fourth time), and signal D is pulsed within the activation period of time (e.g., pulsed between the third time and the fourth time). The timing of the signals during the second control logic sequence is also shown on the left side of FIG. 6.

When transistor 402 is activated, it begins to source (or drive) a small current to shared node 420. Signal D is strobed with a logic high level pulse while transistor 402 is actively sourcing current. In other words, signal D goes high after transistor 402 is activated by signal C going high, and signal D goes low before transistor 402 is deactivated by signal C going low. It is also noted that signal D is strobed after a settle time has elapsed to allow another decoded binary state produced at shared node 420 to become stable. The logic high level pulse of signal D activates MSB register 412 to store the stable state at node 420 as a binary digit (e.g., 0 or 1). Transistor 402 is then deactivated after strobe is complete. It is noted that during the second control logic sequence, signal A carries a logic low level and signal C carries a logic high level, which results in signal F carrying a logic low level.

The right side of FIG. 7 illustrates a truth table 702 for quaternary logic states determined by each quaternary input decoder 306 in response to the two control logic sequences 700 on the left side of FIG. 7. A unique pair of binary digits are decoded for each of the four quaternary states. The first quaternary logic state of a logic low state is decoded in entries (1) and (2) of truth table 702, a second quaternary logic state of a logic high state is decoded in entries (3) and (4), a third logic quaternary state of a floating state is decoded in entries (5) and (6), and a fourth logic quaternary state of a tie-back state is decoded in entries (7) and (8). It is noted that the quaternary logic state is successfully decoded at the completion of sequence 2, as indicated by the decoded state being listed in the entries corresponding to sequence 2.

As shown in entry (1), when the input E carries a logic low state (e.g., is tied to a ground supply) when the weak n-type transistor 408 is activated during sequence 1, transistor 408 attempts to sink current from shared node 420. When signal B is strobed, the LSB register 416 stores a 0 since transistor 408 is "pulling down" a grounded shared node 420. As shown in entry (2), when the weak p-type transistor 402 is activated during sequence 2, transistor 402 attempts to source current to shared node 420. However, transistor 402 does not have enough sourcing current to overcome the ground supply's sinking current at shared node 420 and cannot "pull up" shared node 420, so the MSB register 412 stores a 0 when signal D is strobed. As shown, a logic low state is decoded into binary digits [0:0].

As shown in entry (3), when the input E carries a logic high state (e.g., is tied to a positive supply) when the weak n-type transistor 408 is activated during sequence 1, transistor 408 attempts to sink current from shared node 420.

However, transistor 408 does not have enough sinking current to overcome the positive supply's sourcing current at shared node 420 and cannot "pull down" shared node 420, so the LSB register 416 stores a 1 when signal B is strobed. As shown in entry (4), when the weak p-type transistor 402 is activated during sequence 2, transistor 402 attempts to source current to shared node 420. When signal D is strobed, the MSB register 412 stores a 1 since transistor 402 is "pulling up" a positive supply at the node 420. As shown, a logic high state is decoded into binary digits [1:1].

As shown in entry (4), when the input E carries a floating state (e.g., is unconnected) when the weak n-type transistor 408 is activated during sequence 1, transistor 408 attempts to sink current from shared node 420. When signal B is strobed, the LSB register 416 stores a 0 since transistor 408 successfully sinks or "pulls down" the floating shared node 420. As shown in entry (5), when the weak p-type transistor 402 is activated during sequence 2, transistor 402 attempts to source current to shared node 420. When signal D is strobed, the MSB register 412 stores a 1 since transistor 402 successfully "pulls up" the floating shared node 420. As shown, a floating state is decoded into binary digits [1:0].

As shown in entry (7), when the input E carries a tie-back state (e.g., is tied to signal F) when the weak n-type transistor 408 is activated during sequence 1, transistor 408 attempts to sink current from shared node 420. During sequence 1, signal F goes high, passing a sourcing current to node 420. Transistor 408 does not have enough sinking current to overcome signal F's sourcing current at shared node 420, so the LSB register 416 stores a 1 when signal B is strobed. As shown in entry (8), when the weak p-type transistor 402 is activated during sequence 2, transistor 402 attempts to source current to shared node 420. During sequence 2, signal F goes low, passing a sinking current to node 420. Transistor 402 does not have enough sourcing current to overcome signal F's sinking current at shared node 420, so the MSB register 412 stores a 0 when signal D is strobed. As shown, a tie-back state is decoded into binary digits [0:1].

Figure 8:
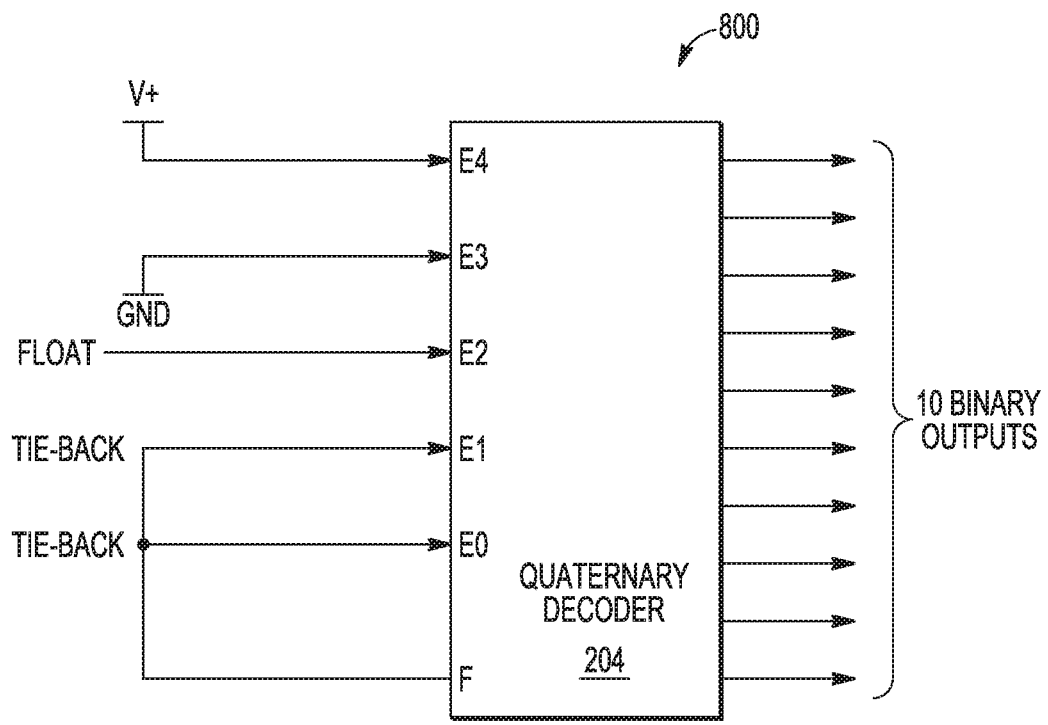
FIGS. 8 and 9 illustrates block diagrams depicting external connections of an example configuration of quaternary lines of a quaternary decoder, according to some embodiments of the present disclosure.

FIG. 8 illustrates an example configuration of quaternary lines provided to quaternary decoder 204. While the quaternary lines may be arranged in any one of various configurations, the example configuration of FIG. 8 illustrates an implementation of each of the four quaternary logic states.

As shown, input line E4 is coupled to a positive power supply voltage (V+, such as Vdd), input line E3 is coupled to a negative power supply voltage (GND), input line E2 is coupled to a floating node (Float), and both input lines E1 and E0 are coupled to an external tie-back node (F). The external tie-back node is coupled to signal F and (in the embodiment discussed herein) provides a positive voltage (such as Vdd) and a sourcing current during sequence 1 and provides a negative voltage (such as ground or Vss) and a sinking current during sequence 2. When the tie-back node is coupled to one or more of the input lines, the sourcing or sinking output current of AND gate 314 is greater (e.g., 10× to 50×) than the small sourcing or sinking currents provided by transistors 402 and 408, even when all inputs E0-E(N-1) are tied to the tie-back node and transistors 402 or transistors 408 are activated in parallel. This ensures the binary states at the shared node 420 are consistent, allowing proper sampling and decoding during the control logic sequences.

Figure 9:
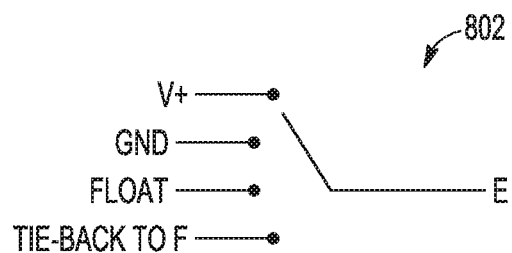

Each input line E may be hardwired or directly connected to its respective quaternary input state in some embodiments, or may be coupled to its respective quaternary logic state by a switching element 802 in other embodiments, which provides a dynamic or selectable configuration of the input lines. Such an example switching element 802 is illustrated in FIG. 9. The switching element 802 includes an electrode coupled to a quaternary input line E and another electrode that is configurable to be coupled to one of four nodes: a node tied to a positive power supply voltage (shown as V+, which may be Vdd), a node tied to a negative power supply voltage (shown as GND, which may be ground or Vss), a node that is unconnected (shown as FLOAT), and a node tied to the output node of tie-back circuit 310 (shown as TIE-BACK TO F). The switching element 802 is configured to select one of the four nodes (e.g., as configured by a user) and couple the selected node to node E, allowing a selected one of the four quaternary logic states to be provided at each quaternary input line E. In some embodiments, the switching elements may be implemented using one or more transistors, such as n-type or p-type transistors, or other suitable switching devices, such as jumpers or shunts.

It is noted that each switching element 802 is located externally to the quaternary decoder 204, and may be even located externally to the package that includes the quaternary decoder 204. For example, the right electrode (as shown in FIG. 9) of the switching element 802 may be coupled to a respective external I/O connection (e.g., to a solder ball) of the quaternary decoder 204 and the left electrode may be coupled to the nodes that implement the quaternary logic states. In other embodiments, each input line may have a dedicated connection to its respective quaternary logic state to provide a static configuration of the input lines.

Figure 10:
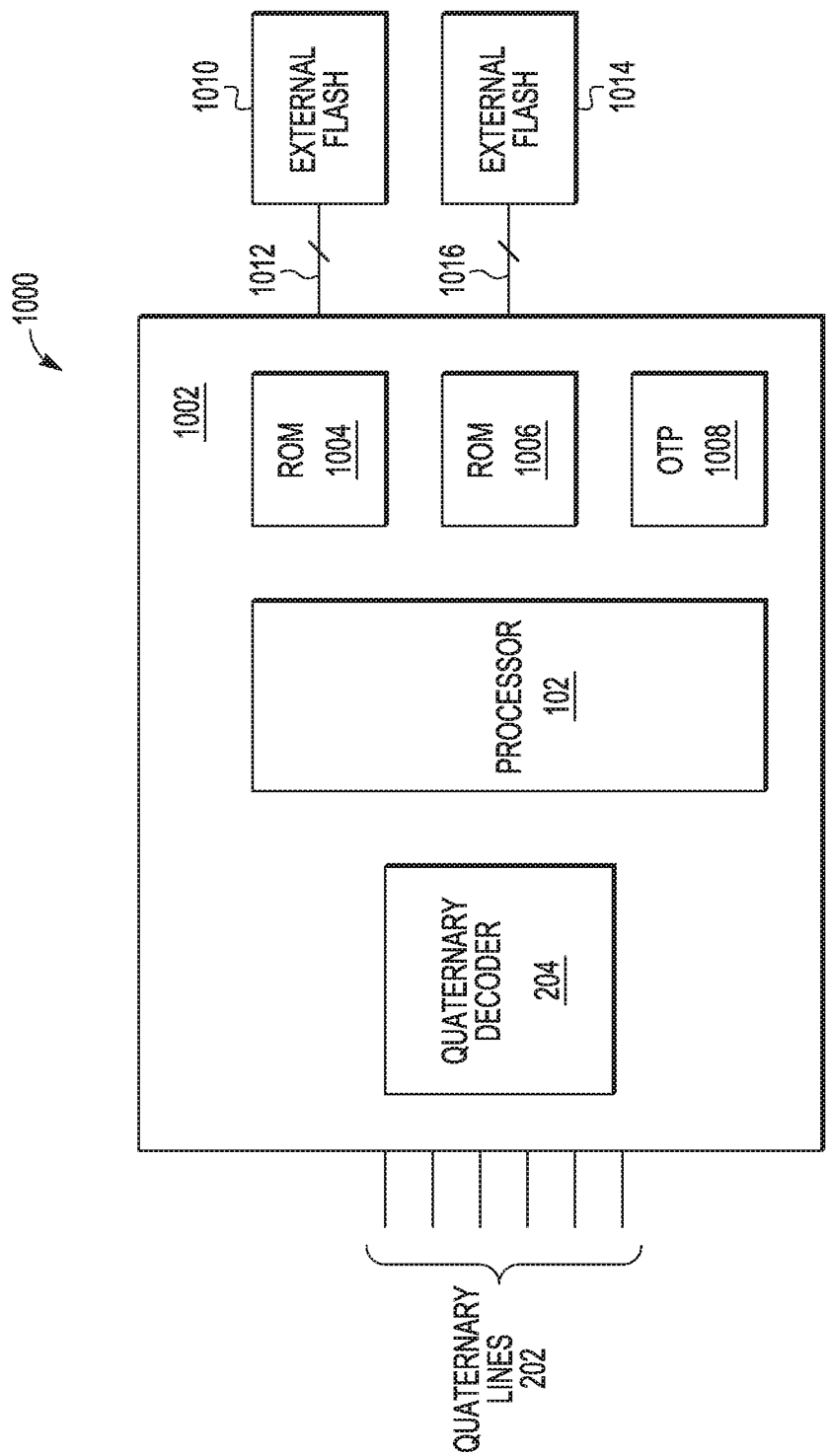
FIG. 10 is a block diagram illustrating relevant components of an example computing device in which the present disclosure can be implemented, according to one embodiment.

FIG. 10 is a block diagram illustrating relevant components of an example computing device 1000 in which the present disclosure can be implemented. In the example shown, computing device 1000 includes quaternary decoder 204 and processor 102, which are coupled as discussed above in connection with FIG. 2. In some embodiments, quaternary decoder 204 and processor 102 may be implemented as part of an integrated circuit 1002. Integrated circuit 1002 may also include other components, examples of which include but are not limited to: a processor, memory, logic, analog circuitry, sensor, a MEMS device, a standalone discrete or passive device such as a resistor, inductor, capacitor, diode, power transistor, and the like. In some embodiments, device may be a combination of the integrated circuit types listed above or may be another type of microelectronic device.

In the example shown, integrated circuit 1002 includes two read-only-memory (ROM) modules 1004 and 1006 and a one-time-programmable (OTP) memory module 1008, which provide a number of different selectable boot-up sources. Integrated circuit 1002 may also include a number of interfaces to external components, such as additional memory modules. In the example shown, integrated circuit 1002 includes an interface 1012 to an external flash module 1010 and an interface 1016 to an external flash module 1014, which provide a number of additional selectable boot-up sources. Quaternary decoder 204 also receives input from a number of quaternary lines 202, which may be respectively connected to a number of external contacts, such as package pins or solder balls.

Integrated circuit 1002 and any external components are packaged within the computing device 1000. For example, integrated circuit 1002 and the external components may be mounted to a package substrate made of a dielectric material with conductive structures, such as plating, pads, interconnects, vias for providing electrical connections from the integrated circuit 1002 to external conductive package structures such as solder balls, and the like. Examples of a package substrate include but are not limited to: a ball grid array (BGA) package, a pin grid array package, an in-line package, a flat package, a chip carrier, and the like.

In other embodiments, the components of computing device 1000 are located on a number of separate integrated circuits that are packaged within a same device. For example, ROM 1004 and 1006 and OTP 1008 may be located on a different integrated circuit than quaternary decoder 204 and processor 102, but mounted to the same package substrate. Computing device 1000 may also include one or more I/O devices for providing input or displaying output.

Each selectable boot-up source includes executable program code or instructions stored in computer readable media such as ROM 1004, ROM 1006, OTP 1008, external flash 1010, or external flash 1014. Such computer readable media may be permanently or removably coupled to processor 102. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

Processor 102 is configured to execute the selected boot-up source code, and may also be configured to execute other programs stored in the computer readable memory. The selected boot-up source code initializes the computing device 1000. The selected boot-up source code may include instructions for an operating system that is configured to manage the execution of other programs stored in the computer readable memory. In some embodiments, computing device 1000 is part of an appliance that requires an input selection provided by a user via quaternary decoder 204, where the appliance includes a separate and discrete hardware device external to computing device 1000.

By now it should be appreciated that there has been provided a quaternary decoding approach for reducing the number of input signals needed for a processor boot-up source and mode selection by use of quaternary logic states. The present quaternary decoding approach utilizes only two voltage levels (rather than multiple voltage levels), which is consistent with CMOS practice.

In one embodiment of the present disclosure, an integrated circuit is provided, which includes a quaternary decoder that in turn includes: a plurality of decoder circuits, each decoder circuit coupled to a respective input line of a plurality of quaternary interface lines, each decoder circuit further coupled to a respective pair of binary output lines; and a control logic circuit having a plurality of control signal lines coupled to each of the plurality of decoder circuits. The control logic circuit is configured to: output a first sequence of logic levels on the plurality of control signal lines, and output a second sequence of logic levels on the plurality of control signal lines after the first sequence is complete. At a time after the second sequence is complete, each decoder circuit is configured to output a pair of binary data values on the respective pair of binary output lines that correspond to a quaternary state of the respective input line, the quaternary state being one of four quaternary states including a logic high state, a logic low state, a floating state, and a tie-back state.

One aspect of the above embodiment provides that the quaternary decoder further includes: a tie-back state circuit having an output coupled to an external tie-back line of the plurality of quaternary interface lines, wherein ones of the plurality of control signal lines are coupled to the tie-back state circuit.

A further aspect of the above embodiment provides that the logic high state indicates the respective input line is connected to a positive power supply voltage, the logic low state indicates the respective input line is connected to a negative power supply voltage, the floating state indicates the respective input line is unconnected, and the tie-back state indicates the respective input line is connected to the external tie-back line.

Another further aspect of the above embodiment provides that the integrated circuit further includes: a plurality of switches coupled to each respective input line, the plurality of switches configured to couple each respective input line to one of a logic high voltage terminal, a logic low voltage terminal, an open connection, and the external tie-back line.

Another aspect of the above embodiment provides that each decoder circuit includes: an n-type transistor having a first current electrode coupled to a negative power supply voltage, a second current electrode coupled to a shared node, and a control gate electrode coupled to a first control signal line, a p-type transistor having a first current electrode coupled to the shared node, a second current electrode coupled to a positive power supply voltage, and a control gate electrode coupled to a second control signal line, and the shared node is coupled to the respective input line.

A further aspect of the above embodiment provides that each decoder circuit further includes: a first register having a data input coupled to the shared node and a strobe input coupled to a third control signal line, the first register configured to capture a least significant binary data value in response to the first sequence of logic levels, a second register having a data input coupled to the shared node and a strobe input coupled to a fourth control signal line, the second register configured to capture a most significant binary data value in response to the second sequence of logic levels, wherein the pair of binary data values include the least and most significant binary data values.

A still further aspect of the above embodiment provides that the first sequence of logic levels activates the n-type transistor at a first time and strobes the first register at a second time after the first time, the second sequence of logic levels activates the p-type transistor at a third time and strobes the second register at a fourth time after the third time, the least significant binary data value is based on a first voltage level present at the shared node when the first register is strobed, and the most significant binary data value is based on a second voltage level present at the shared node when the second register is strobed.

Another aspect of the above embodiment provides that the integrated circuit, further includes: a processor coupled to each respective pair of binary output lines of each decoder circuit, the binary output lines of the quaternary decoder in aggregate provide a resulting set of binary digits to the processor.

A further aspect of the above embodiment provides that the resulting set of binary digits indicates a selection of at least one of a group including a boot-up source and a boot-up mode for the processor.

In another embodiment of the present disclosure, a quaternary decoder is provided, including: a plurality of decoder circuits, each decoder circuit including: an n-type transistor having a first current electrode coupled to a first power supply voltage, a second current electrode coupled to a shared node, and a control gate electrode coupled to a first control signal line; a p-type transistor having a first current electrode coupled to the shared node, a second current electrode coupled to a second power supply voltage, and a control gate electrode coupled to a second control signal line; a first register having a data input coupled to the shared node and a strobe input coupled to a third control signal line, the first register configured to store a least significant binary data value; a second register having a data input coupled to the shared node and a strobe input coupled to a fourth control signal line, the second register configured to store a most significant binary data value; and an input line coupled to the shared node, wherein a quaternary state of the input line is one of a logic high state, a logic low state, a floating state, and a tie-back state, and the least and most significant binary data values correspond to the quaternary state.

One aspect of the above embodiment provides that the quaternary decoder further includes: a tie-back state circuit including: a logic gate having a first input coupled to the first control signal line, a second input coupled to the second control signal line, and an output coupled to a tie-back line.

Another aspect of the above embodiment provides that the quaternary decoder further includes: logic circuitry coupled to the first, second, third, and fourth control signal lines, wherein the logic circuitry is configured to: output a first sequence of logic levels configured to activate the n-type transistor for a first period of time and strobe the first register within the first period of time, and output a second sequence of logic levels after the first sequence, the second sequence configured to activate the p-type transistor for a second period of time and strobe the second register within the second period of time.

A further aspect of the above embodiment provides that the quaternary decoder further includes: an inverter coupled between the second control signal line output by the logic circuitry and the control gate electrode of the p-type transistor.

Another further aspect of the above embodiment provides that the first register of each decoder circuit is configured to store the least significant binary data value based on a first voltage level present at the shared node when the first register is strobed, and the second register of each decoder circuit is configured to store the most significant binary data value based on a second voltage level present at the shared node when the second register is strobed.

Another further aspect of the above embodiment provides that the first sequence of logic levels include: a steady logic level on the first control signal line to activate the n-type transistor at a first time, a logic level pulse on the third control signal line to store a first bit state of the shared node in the first register at a second time after the first time, a steady logic level on the first control signal line to deactivate the n-type transistor at a third time after the pulse is complete, a steady logic level on the second control line to deactivate the p-type transistor, and a steady logic level on the fourth control signal line to disable the second register.

A still further aspect of the above embodiment provides that the second sequence of logic levels include: a steady logic level on the first control signal line to deactivate the n-type transistor, a steady logic level on the third control signal line to retain the first bit state stored in the first register during the first sequence of logic levels, a steady logic level on the second control line to activate the p-type transistor at a fourth time, a logic level pulse on the fourth control signal line to store a second bit state of the shared node in the second register at a fifth time after the fourth time, and a steady logic level on the second control line to deactivate the p-type transistor after the pulse is complete.

Another aspect of the above embodiment provides that the least and most significant binary data values of the plurality of decoder circuits in aggregate form a set of binary digits, and the quaternary state of the input line of the plurality of decoder circuits in aggregate form a set of quaternary digits.

Another aspect of the above embodiment provides that the first power supply voltage is ground, and the second power supply voltage is a positive power supply voltage.

In another embodiment of the present disclosure, a method for operating a quaternary decoder is provided, the method including: activating an n-type transistor and deactivating a p-type transistor for a first time period, wherein the n-type transistor has a first current electrode coupled to a first power supply voltage terminal and a second current electrode coupled to a shared node, the p-type transistor has a first current electrode coupled to the shared node and a second current electrode coupled to a second power supply voltage terminal, and the shared node is further coupled to an input node; strobing a first register during the first time period, the first register having a data input line coupled to the shared node and configured to capture a first binary data value based on a first voltage level present at the shared node; deactivating the n-type transistor and activating the p-type transistor for a second time period subsequent to the first time period; strobing a second register during the second time period, the second register having a data input line coupled to the shared node and configured to capture a second binary data value based on a second voltage level present at the shared node; and outputting the first and second binary data values during a third time period subsequent to the second time period, wherein the first and second binary data values correspond to a quaternary state of the input node, the quaternary state being one of a logic high state, a logic low state, a floating state, and a tie-back state.

One aspect of the above embodiment provides that the quaternary decoder includes a plurality of decoder circuits, each decoder circuit including a respective one of the n-type transistor, the p-type transistor, the first register, the second register, the shared node, and the input node, and the activating the n-type transistor and deactivating the p-type transistor, the strobing the first register, the deactivating the n-type transistor and activating the p-type transistor, the strobing the second register, and the outputting the first and second binary data values are performed simultaneously for each of the decoder circuits.

The circuitry described herein, such as the circuitry of quaternary decoder 204, may be implemented on a semiconductor substrate or wafer, which can be any semiconductor material or combinations of materials, such as gallium arsenide, silicon germanium, silicon-on-insulator (SOI), silicon, monocrystalline silicon, the like, and combinations of the above.

The circuitry described herein may be formed using a sequence of numerous process steps applied to the semiconductor substrate, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

As used herein, the terms "substantial" and "substantially" mean sufficient to achieve the stated purpose or value in a practical manner, taking into account any minor imperfections or deviations, if any, that arise from usual and expected process abnormalities that may occur during device fabrication, which are not significant for the stated purpose or value.

Although the invention is described herein with reference to specific embodiments, various modifications and changes can be made without departing from the scope of the present invention as set forth in the claims below. For example, additional or fewer quaternary lines may be implemented in FIG. 2. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   a quaternary decoder comprising:
      a plurality of decoder circuits, each decoder circuit coupled to a respective input line of a plurality of quaternary interface lines, each decoder circuit further coupled to a respective pair of binary output lines; and a control logic circuit having a plurality of control signal lines coupled to each of the plurality of decoder circuits, wherein
the control logic circuit is configured to:
output a first sequence of logic levels on the plurality of control signal lines, and
output a second sequence of logic levels on the plurality of control signal lines after the first sequence is complete;
wherein at a time after the second sequence is complete, each decoder circuit is configured to output a pair of binary data values on the respective pair of binary output lines that correspond to a quaternary state of the respective input line, the quaternary state being one of four quaternary states including a logic high state, a logic low state, a floating state, and a tie-back state.

2. The integrated circuit of claim 1, wherein the quaternary decoder further comprises:
a tie-back state circuit having an output coupled to an external tie-back line of the plurality of quaternary interface lines, wherein ones of the plurality of control signal lines are coupled to the tie-back state circuit.

3. The integrated circuit of claim 2, wherein
the logic high state indicates the respective input line is connected to a positive power supply voltage,
the logic low state indicates the respective input line is connected to a negative power supply voltage,
the floating state indicates the respective input line is unconnected, and
the tie-back state indicates the respective input line is connected to the external tie-back line.

4. The integrated circuit of claim 2, further comprising:
a plurality of switches coupled to each respective input line, the plurality of switches configured to couple each respective input line to one of a logic high voltage terminal, a logic low voltage terminal, an open connection, and the external tie-back line.

5. The integrated circuit of claim 1, wherein each decoder circuit comprises:
an n-type transistor having a first current electrode coupled to a negative power supply voltage, a second current electrode coupled to a shared node, and a control gate electrode coupled to a first control signal line,
a p-type transistor having a first current electrode coupled to the shared node, a second current electrode coupled to a positive power supply voltage, and a control gate electrode coupled to a second control signal line, and
the shared node is coupled to the respective input line.

6. The integrated circuit of claim 5, wherein each decoder circuit further comprises:
a first register having a data input coupled to the shared node and a strobe input coupled to a third control signal line, the first register configured to capture a least significant binary data value in response to the first sequence of logic levels,
a second register having a data input coupled to the shared node and a strobe input coupled to a fourth control signal line, the second register configured to capture a most significant binary data value in response to the second sequence of logic levels,
wherein the pair of binary data values comprise the least and most significant binary data values.

7. The integrated circuit of claim 6, wherein
the first sequence of logic levels activates the n-type transistor at a first time and strobes the first register at a second time after the first time,
the second sequence of logic levels activates the p-type transistor at a third time and strobes the second register at a fourth time after the third time,
the least significant binary data value is based on a first voltage level present at the shared node when the first register is strobed, and
the most significant binary data value is based on a second voltage level present at the shared node when the second register is strobed.

8. The integrated circuit of claim 1, further comprising:
a processor coupled to each respective pair of binary output lines of each decoder circuit, the binary output lines of the quaternary decoder in aggregate provide a resulting set of binary digits to the processor.

9. The integrated circuit of claim 8, wherein
the resulting set of binary digits indicates a selection of at least one of a group including a boot-up source and a boot-up mode for the processor.

10. A quaternary decoder comprising:
a plurality of decoder circuits, each decoder circuit comprising:
an n-type transistor having a first current electrode coupled to a first power supply voltage, a second current electrode coupled to a shared node, and a control gate electrode coupled to a first control signal line;
a p-type transistor having a first current electrode coupled to the shared node, a second current electrode coupled to a second power supply voltage, and a control gate electrode coupled to a second control signal line;
a first register having a data input coupled to the shared node and a strobe input coupled to a third control signal line, the first register configured to store a least significant binary data value;
a second register having a data input coupled to the shared node and a strobe input coupled to a fourth control signal line, the second register configured to store a most significant binary data value; and
an input line coupled to the shared node, wherein
a quaternary state of the input line is one of a logic high state, a logic low state, a floating state, and a tie-back state, and
the least and most significant binary data values correspond to the quaternary state.

11. The quaternary decoder of claim 10, further comprising:
a tie-back state circuit comprising:
a logic gate having a first input coupled to the first control signal line, a second input coupled to the second control signal line, and an output coupled to a tie-back line.

12. The quaternary decoder of claim 10, further comprising:
logic circuitry coupled to the first, second, third, and fourth control signal lines, wherein the logic circuitry is configured to:
output a first sequence of logic levels configured to activate the n-type transistor for a first period of time and strobe the first register within the first period of time, and
output a second sequence of logic levels after the first sequence, the second sequence configured to activate the p-type transistor for a second period of time and strobe the second register within the second period of time.

13. The quaternary decoder of claim 12, further comprising:
an inverter coupled between the second control signal line output by the logic circuitry and the control gate electrode of the p-type transistor.

14. The quaternary decoder of claim 12, wherein
the first register of each decoder circuit is configured to store the least significant binary data value based on a first voltage level present at the shared node when the first register is strobed, and
the second register of each decoder circuit is configured to store the most significant binary data value based on a second voltage level present at the shared node when the second register is strobed.

15. The quaternary decoder of claim 12, wherein
the first sequence of logic levels comprise:
a steady logic level on the first control signal line to activate the n-type transistor at a first time,
a logic level pulse on the third control signal line to store a first bit state of the shared node in the first register at a second time after the first time,
a steady logic level on the first control signal line to deactivate the n-type transistor at a third time after the pulse is complete,
a steady logic level on the second control line to deactivate the p-type transistor, and
a steady logic level on the fourth control signal line to disable the second register.

16. The quaternary decoder of claim 15, wherein
the second sequence of logic levels comprise:
a steady logic level on the first control signal line to deactivate the n-type transistor,
a steady logic level on the third control signal line to retain the first bit state stored in the first register during the first sequence of logic levels,
a steady logic level on the second control line to activate the p-type transistor at a fourth time,
a logic level pulse on the fourth control signal line to store a second bit state of the shared node in the second register at a fifth time after the fourth time, and
a steady logic level on the second control line to deactivate the p-type transistor after the pulse is complete.

17. The quaternary decoder of claim 10, wherein
the least and most significant binary data values of the plurality of decoder circuits in aggregate form a set of binary digits, and
the quaternary state of the input line of the plurality of decoder circuits in aggregate form a set of quaternary digits.

18. The quaternary decoder of claim 10, wherein
the first power supply voltage is ground, and
the second power supply voltage is a positive power supply voltage.

19. A method for operating a quaternary decoder, the method comprising:
activating an n-type transistor and deactivating a p-type transistor for a first time period, wherein
the n-type transistor has a first current electrode coupled to a first power supply voltage terminal and a second current electrode coupled to a shared node,
the p-type transistor has a first current electrode coupled to the shared node and a second current electrode coupled to a second power supply voltage terminal, and
the shared node is further coupled to an input node;
strobing a first register during the first time period, the first register having a data input line coupled to the shared node and configured to capture a first binary data value based on a first voltage level present at the shared node;
deactivating the n-type transistor and activating the p-type transistor for a second time period subsequent to the first time period;
strobing a second register during the second time period, the second register having a data input line coupled to the shared node and configured to capture a second binary data value based on a second voltage level present at the shared node; and
outputting the first and second binary data values during a third time period subsequent to the second time period, wherein the first and second binary data values correspond to a quaternary state of the input node, the quaternary state being one of a logic high state, a logic low state, a floating state, and a tie-back state.

20. The method of claim 19, wherein
the quaternary decoder comprises a plurality of decoder circuits, each decoder circuit including a respective one of the n-type transistor, the p-type transistor, the first register, the second register, the shared node, and the input node, and
the activating the n-type transistor and deactivating the p-type transistor, the strobing the first register, the deactivating the n-type transistor and activating the p-type transistor, the strobing the second register, and the outputting the first and second binary data values are performed simultaneously for each of the decoder circuits.

* * * * *